United States Patent
Zhao et al.

(10) Patent No.: US 8,179,187 B2
(45) Date of Patent: May 15, 2012

(54) SUBSTRATE NOISE PASSIVE CANCELLATION METHOD FOR BUCK CONVERTER

(75) Inventors: Hongwei Zhao, Beijing (CN); Jian Yang, Beijing (CN); Iven Zheng, Beijing (CN); Tommy Mao, Beijing (CN); Waley Li, Beijing (CN)

(73) Assignee: Freescale Semiconductor, Inc., Austin, TX (US)

( * ) Notice: Subject to any disclaimer, the term of this patent is extended or adjusted under 35 U.S.C. 154(b) by 361 days.

(21) Appl. No.: 12/578,569

(22) Filed: Oct. 13, 2009

(65) Prior Publication Data
US 2010/0102875 A1  Apr. 29, 2010

(30) Foreign Application Priority Data
Oct. 29, 2008 (CN) .......................... 2008 1 0173862

(51) Int. Cl.
*H03K 17/16* (2006.01)
(52) U.S. Cl. ........................................ 327/384; 327/112
(58) Field of Classification Search .................. None
See application file for complete search history.

(56) References Cited

U.S. PATENT DOCUMENTS

| | | | |
|---|---|---|---|
| 6,040,728 A | 3/2000 | Nelson et al. | |
| 6,642,697 B2 * | 11/2003 | Zuniga et al. | 323/223 |
| 6,713,823 B1 * | 3/2004 | Nickel | 257/401 |
| 6,980,039 B1 * | 12/2005 | Dening et al. | 327/164 |
| 7,145,786 B2 | 12/2006 | Vinciarelli | |
| 7,564,702 B2 | 7/2009 | Schlecht | |
| 7,710,167 B2 * | 5/2010 | Bernacchia | 327/108 |
| 7,746,042 B2 * | 6/2010 | Williams et al. | 323/223 |
| 7,940,118 B1 * | 5/2011 | Forghani-zadeh et al. | 327/536 |
| 7,990,205 B2 * | 8/2011 | Jung | 327/536 |
| 2008/0018366 A1 * | 1/2008 | Hanna | 327/112 |
| 2008/0084197 A1 | 4/2008 | Williams et al. | |

OTHER PUBLICATIONS

Shoyama, M.; Tsumura, T.; Ninomiya, T, <<Mechanism of common-mode noise reduction in balanced boost switching converter>>, Power Electronics Specialists Conference, 2004. PESC 04. 2004 IEEE 35th Annual, vol. 2, Jun. 20-25, 2004 pp. 1115-1120 vol. 2.

* cited by examiner

*Primary Examiner* — Cassandra Cox
(74) *Attorney, Agent, or Firm* — Charles Bergere

(57) ABSTRACT

A method for passive cancellation of substrate noise for a buck converter uses an on-chip capacitor to reduce the substrate noise. The capacitor achieves a close-magnitude noise with opposite phase for better noise cancellation effect in the substrate. The capacitor can be realized as a MOS capacitor, NMOS isolation ring n-well capacitor, n-well junction capacitor, isolated p-well junction capacitor, etc. The capacitor is easy to implement. Further, bond wire parasitic inductance in the buck converter is used to reduce substrate noise.

18 Claims, 4 Drawing Sheets

SUBSTRATE NOISE PASSIVE CANCELLATION METHOD FOR BUCK CONVERTER

BACKGROUND OF THE INVENTION

The present invention relates to cancellation of substrate noise in a semiconductor device, and more particularly, to a passive cancellation method of substrate noise for a buck converter.

A buck converter is a well-known device in the art. Switching of the buck converter injects noise into the substrate, which affects analog circuit blocks. Traditional isolation methods do not reduce substrate noise enough.

U.S. Pat. No. 6,040,728 of Dale H. Nelson, et. al., provides an active substrate noise injection cancellation method that requires a specially designed operational amplifier, which is complicated.

The paper entitled "Mechanism of Common-Mode Noise Reduction in Balanced Boost Switching Converter" (35th Annual IEEE Power Electronics Specialists Conference, Pages: 1115-1120 Vol. 2, 20-25, Jun. 2004) by M. Shoyama et. al., proposes a mechanism of common-mode noise reduction that utilizes a big load inductor in a boost converter to reduce noise on frame ground.

FIG. 1 schematically shows a circuit structure of a buck converter. In FIG. 1, for a buck converter without an external Schottky diode, due to parasitic inductance of the power supply, points A and B are noisy and have opposite phases. Substrate noise is injected through one n-well/p-substrate junction from point A and through two junctions from point B, leading to different noise magnitudes.

It would be advantageous to have a method that can effectively reduce substrate noise in a buck converter generated by switching.

BRIEF DESCRIPTION OF THE DRAWINGS

The objects and advantages of the present invention will become more apparent to the skilled in the art by referring to the accompanying drawings.

DETAILED DESCRIPTION OF THE INVENTION

Figure 1:
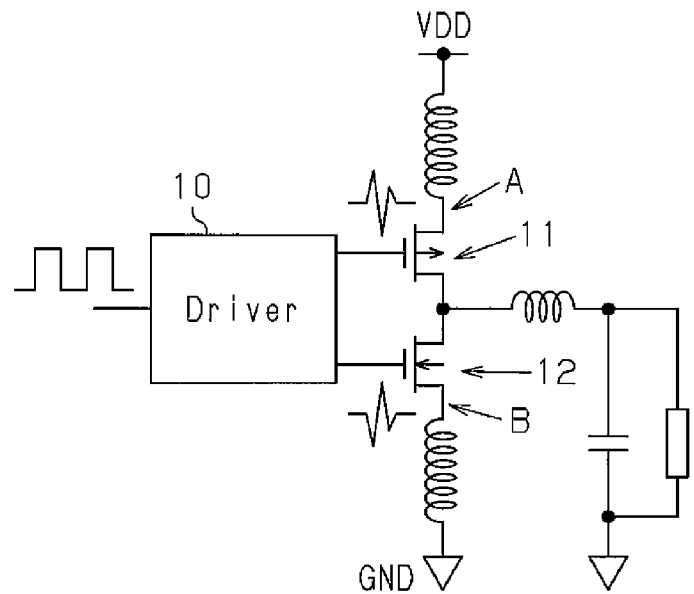
FIG. 1 schematically shows the circuit structure of a buck converter.

Various embodiments of the present invention will be described in detail with reference to the accompanying drawings.

In order to solve the problems discussed in the Background section, the present invention provides a new and simple technique that reduces substrate noise and improves circuit performance. As previously discussed, for a buck converter without an external Schottky diode, due to parasitic inductance of the power supply, points A and B are noisy and have opposite phases and different noise magnitudes. The present invention provides an added capacitor to achieve a close-magnitude noise with opposite phase for better noise cancellation effect in the substrate. The added capacitor can be realized with a MOS capacitor, an NMOS isolation ring n-well capacitor, an n-well junction capacitor, an isolated p-well junction capacitor, etc.

In contrast to the prior art, the present invention is easy to implement. Moreover, the present invention uses bond wire parasitic inductance in the buck converter to reduce substrate noise. Thus, the present invention provides a passive cancellation method using an on-chip capacitor to reduce the substrate noise in a buck converter.

In one embodiment, the present invention provides a buck converter formed in a substrate, including a P-channel Metal Oxide Semiconductor (PMOS) device, wherein a driver signal is input to a gate of the PMOS device; a N-channel Metal Oxide Semiconductor (NMOS) device, wherein the driver signal is input to a gate of the NMOS device. The PMOS and NMOS devices are coupled with each other in series between a voltage source and a GND. A capacitor is connected to a first node connected between the PMOS device and the NMOS device, and the GND, respectively. The capacitor generates close-magnitude noises with opposite phases at a second node located between the PMOS device and the voltage source and at a third node located between the NMOS device and the GND.

Preferably, in the buck converter of the present invention, the PMOS device is formed in a p-type substrate and has a first n-type well, and the NMOS device is formed in the p-type substrate and has a second n-type well and a first p-type well in the second n-type well. In one embodiment of the present invention, the capacitor is a MOS capacitor.

Preferably, the MOS capacitor has a third n-type well isolated from the GND, wherein a second p-type well is formed in the p-type substrate for P+ guarding.

In one embodiment, the capacitor is an NMOS isolation ring n-well capacitor. Preferably, the NMOS isolation ring n-well capacitor is formed in the NMOS device by laying out the first n-type well and the second n-type well with the same shape and size.

In another embodiment, the capacitor is an n-well junction capacitor. Preferably, the n-well junction capacitor is formed by providing a fourth n-type well to form an n-well junction and coupling the fourth n-type well to the GND.

In yet another embodiment, the capacitor comprises an isolated p-well junction and a decoupling capacitor is located between the voltage source and the GND. Preferably, the isolated p-well junction and the decoupling capacitor are formed with a third p-type well coupled to the GND, the third p-type well being located in, but isolated from, the first n-type well of the PMOS device and the second n-type well of the NMOS device.

Referring again to FIG. 1, for a buck converter without an external Schottky diode, due to parasitic inductance of the power supply, points A and B are noisy and have opposite phases. Substrate noise is injected through one n-well/p-substrate junction from point A and through two junctions from point B, leading to different noise magnitudes.

Figure 2:
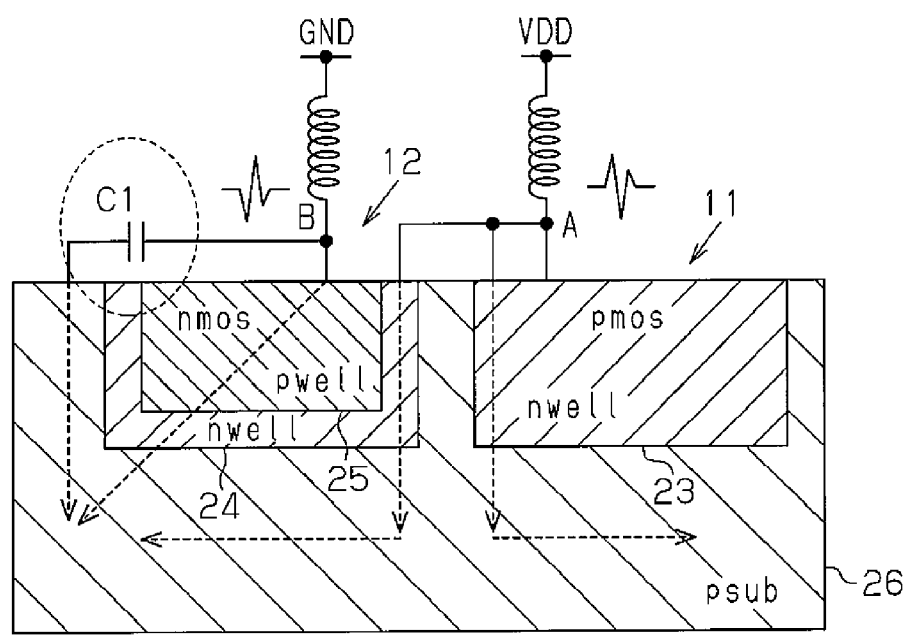
FIG. 2 schematically shows the semiconductor structure of a buck converter in accordance with an embodiment of the present invention.

FIG. 2 schematically shows the semiconductor structure of the buck converter in accordance with an embodiment of the present invention. Referring to FIG. 2, an appropriate capacitor C1 is provided to achieve a close-magnitude noise with opposite phase for better noise cancellation effect in the substrate.

As shown in FIGS. 1 and 2, the buck converter of the present invention is formed in a p-type substrate 26, and comprises a PMOS device 11. A signal of a driver 10 is input to a gate of the PMOS device 11. An NMOS device 12 is also provided. The signal of the driver 10 is input to a gate of the NMOS device 12. The PMOS device 11 and the NMOS device 12 are coupled with each other in series between a voltage source VDD and a GND. A capacitor C1 is connected to a first node (to be connected to a load) connected between the PMOS device 11 and the NMOS device 12, and the GND, respectively. The capacitor C1 generates close-magnitude noises with opposite phases at a second node A located between the PMOS device 11 and the voltage source VDD and at a third node B located between the NMOS device 12 and the GND.

As shown in FIG. 2, the PMOS device 11 is formed in the p-type substrate 26 and has a first n-type well 23. The NMOS device 12 is also formed in the p-type substrate 26 and has a second n-type well 24 and a first p-type well 25 in the second n-type well 24. In FIG. 2, the capacitor C1 has one end connected to the GND via the third node B and another end connected to the p-type substrate 26.

FIGS. 3-6 show four different embodiments of the present invention in which a capacitor is added to the buck converter according to the present invention.

Figure 3:
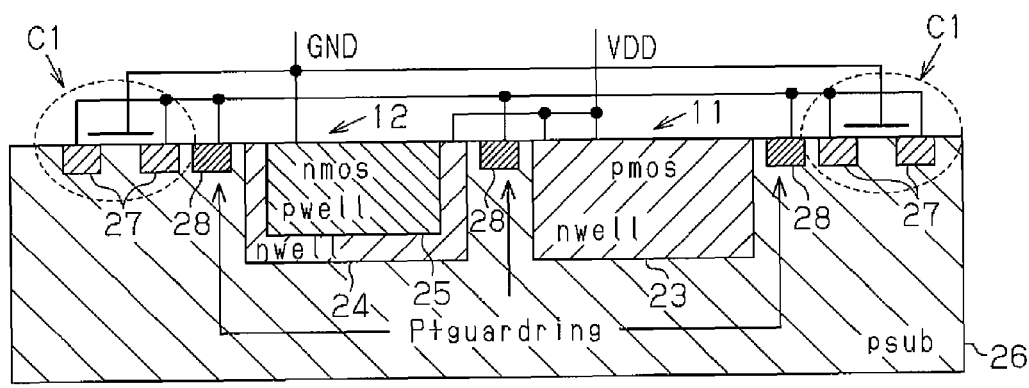
FIG. 3 shows a first embodiment of adding a capacitor to the buck converter of the present invention.

FIG. 3 shows a first implementation of an added capacitor to the buck converter according to the present invention. Referring to FIG. 3, a capacitor C1 is realized as an MOS capacitor. The MOS capacitor C1 has a third n-type well 27 formed in the p-type substrate 26 and isolated from the GND. A second p-type well 28 is formed in the p-type substrate 26 for P+ guarding.

Figure 4:
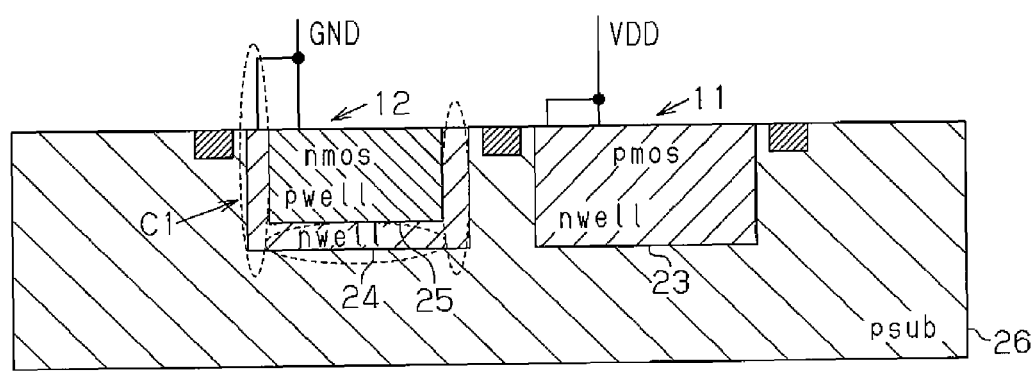
FIG. 4 shows a second embodiment of adding a capacitor to the buck converter of to the present invention.

FIG. 4 shows a second implementation of an added capacitor to the buck converter according to the present invention. Referring to FIG. 4, the capacitor C1 is realized as an NMOS isolation ring n-well capacitor. The NMOS isolation ring n-well capacitor is formed in the NMOS device 12 by laying out the first n-type well 23 and the second n-type well 24 with the same shape and size.

Figure 5:
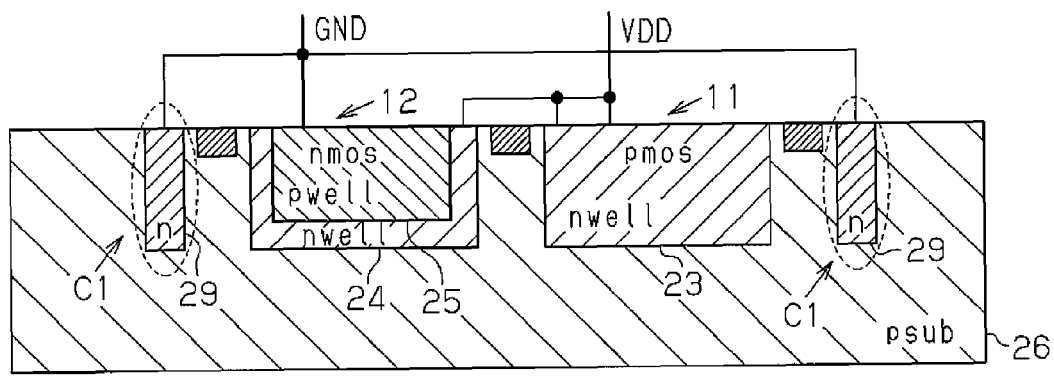
FIG. 5 shows a third embodiment of adding a capacitor to the buck converter of the present invention.

FIG. 5 shows a third implementation of an added capacitor to the buck converter according to the present invention. Referring to FIG. 5, the capacitor C1 is realized as an n-well junction capacitor. The n-well junction capacitor is formed by providing a fourth n-type well 29 in the p-type substrate 26 to form an n-well junction and coupling the fourth n-type well 29 to the GND.

Figure 6:
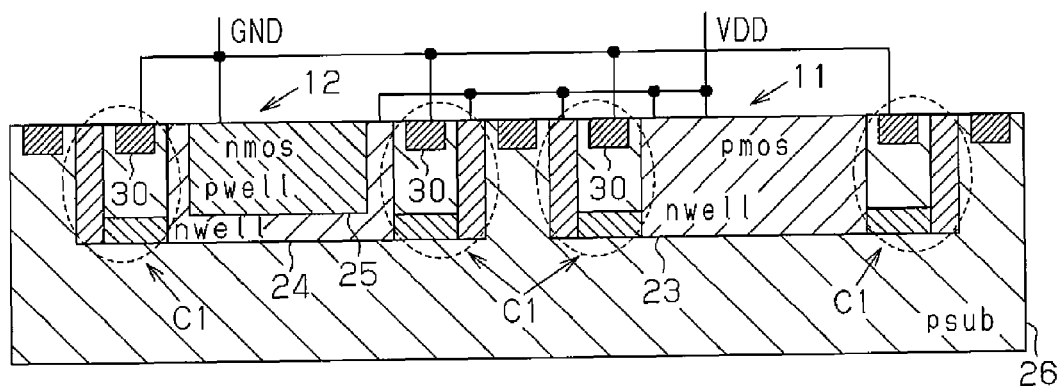
FIG. 6 shows a fourth embodiment of adding a capacitor to the buck converter of the present invention.

FIG. 6 shows a fourth implementation of an added capacitor to the buck converter according to the present invention. Referring to FIG. 6, the capacitor C1 comprises an isolated p-well junction and a decoupling capacitor located between the voltage source VDD and the GND. The isolated p-well junction and the decoupling capacitor are formed with a third p-type well 30 coupled to the GND. The third p-type well 30 is located in, but isolated from, the first n-type well 23 of the PMOS device 11 and the second n-type well 24 of the NMOS device 12.

According to FIGS. 1-6, the present invention further provides a method of manufacturing a buck converter, comprising the steps of:

forming a PMOS device 11, wherein a signal of a driver 10 is input to a gate of the PMOS device 11; forming an NNMOS device 12, wherein the signal of the driver 10 is input to a gate of the NMOS device 12; coupling the PMOS device 11 and the NMOS device 12 with each other in series between a voltage source VDD and a GND; and forming a capacitor C1 connected to a first node (to be connected to a load) connected between the PMOS device 11 and the NMOS device 12 and the GND, respectively. The capacitor C1 generates close-magnitude noises with opposite phases at a second node A located between the PMOS device 11 and the voltage source VDD and at a third node B located between the NMOS device 12 and the GND.

As shown in FIG. 2, the step of forming the PMOS device 11 comprises a step of providing a first n-type well 23 in the p-type substrate 26. The step of forming the NMOS device 12 comprises the steps of providing a second n-type well 24 in the p-type substrate 26 and providing a first p-type well 25 in the second n-type well 24. Also as shown in FIG. 2, the capacitor C1 has one end connected to the GND via the third node B and another end connected to the p-type substrate 26.

When the capacitor C1 is formed as an MOS capacitor (FIG. 3), a third n-type well 27 that is isolated from the GND is provided in the p-type substrate 26, and a second p-type well 28 is further formed in the p-type substrate 26 for P+ guarding. When the capacitor C1 is realized as an NMOS isolation ring n-well capacitor (FIG. 4), the NMOS isolation ring n-well capacitor is formed in the NMOS device 12 by lay outing the first n-type well 23 and the second n-type well 24 with the same shape and size.

When the capacitor C1 is realized as an n-well junction capacitor (FIG. 5), the n-well capacitor is formed by providing a fourth n-type well 29 in the p-type substrate 26 to form an n-well junction and coupling the fourth n-type well 29 to the GND. When the capacitor C1 is realized as comprising an isolated p-well junction and a decoupling capacitor located between the voltage source VDD and the GND (FIG. 6), the isolated p-well junction and the decoupling capacitor are formed with a third p-type well 30 coupled to the GND. The third p-type well 30 is located in, but isolated from, the first n-type well 23 of the PMOS device 11 and the second n-type well 24 of the NMOS device 12.

Figure 7A:
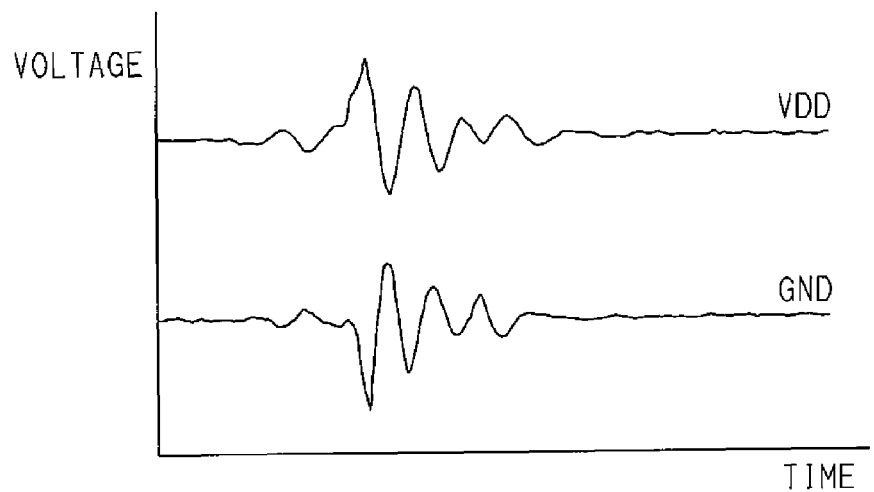
FIGS. 7A and 7B shows a comparison between noises generated at points A and B in the circuit structure of the buck converter of the present invention.
Figure 7B:
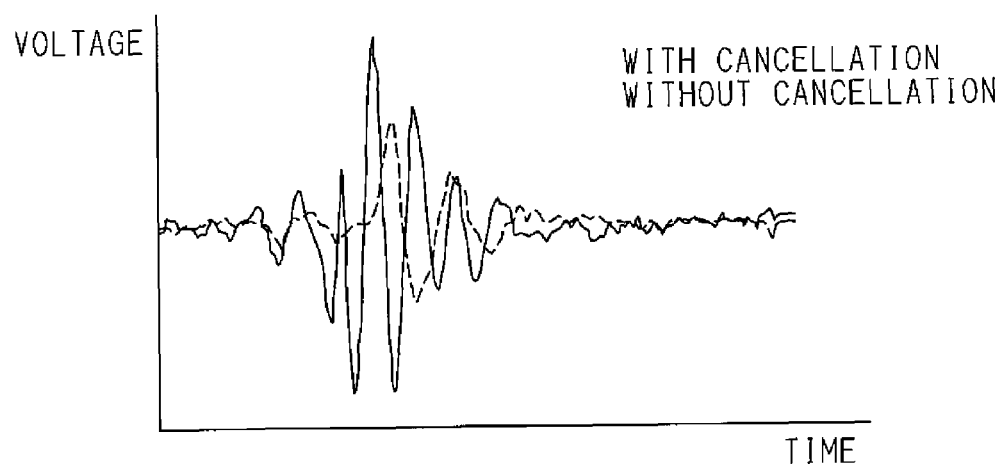
Figure 7B:
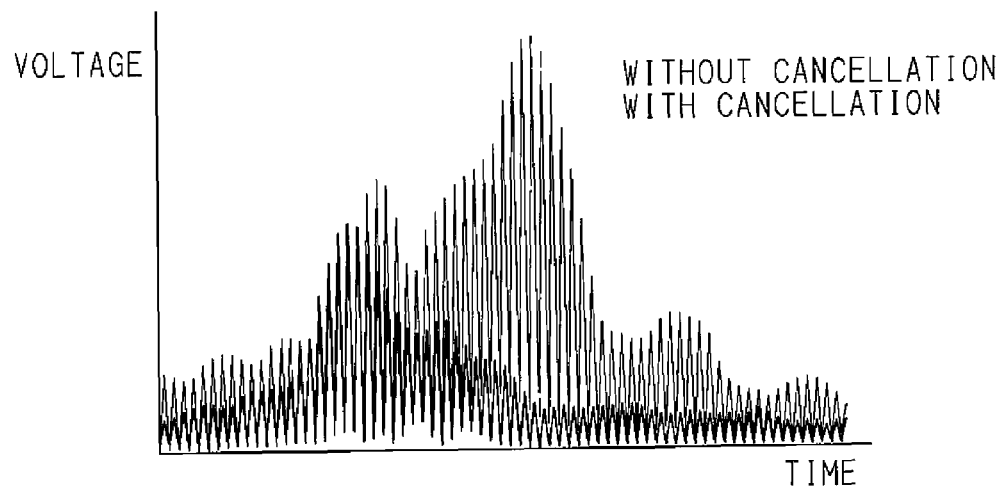

The inventors have performed a silicon verification of the present invention. In the verification, the NMOS capacitor as shown in FIG. 3 is used to realize the capacitor C1. FIGS. 7A and 7B show a comparison between noises generated at points A and B in the circuit structure of the buck converter according to the present invention. The substrate noise cancellation effects are clear in FIGS. 7A and 7B.

FIG. 7A shows waveforms at the voltage source VDD (point A) and the GND (point B). It can be seen from FIG. 7A that the two waveforms have substantially same magnitude and opposite phases. The top graph in FIG. 7B shows a comparison between overlapping substrate noise waveforms, and the bottom graph in FIG. 7B shows a comparison between overlapping substrate noise spectrums.

The present invention further provides a semiconductor device structure, comprising a p-type substrate; a PMOS device that is formed in the p-type substrate and has a first n-type well; an NMOS device that is formed in the p-type substrate and has a second n-type well and a first p-type well in the second n-type well, wherein the PMOS device and the NMOS device are coupled with each other in series between a voltage source and a GND; and a capacitor connected to the p-type substrate and the GND respectively. The capacitor generates close-magnitude noises with opposite phases at a node located between the PMOS device and the voltage source and at another node located between the NMOS device and the GND.

Preferably, the capacitor is a MOS capacitor that has a third n-type well isolated from the GND. A second p-type well is formed in the p-type substrate for P+ guarding.

In one embodiment, the capacitor is an NMOS isolation ring n-well capacitor formed in the NMOS device by laying out the first n-type well and the second n-type well with the same shape and size.

In another embodiment, the capacitor is an n-well junction capacitor formed by providing a fourth n-type well to form an n-well junction and coupling the fourth n-type well to the GND.

In yet another embodiment, the capacitor comprises an isolated p-well junction and a decoupling capacitor located between the voltage source and the GND. The isolated p-well junction and the decoupling capacitor are formed with a third p-type well coupled to the GND, the third p-type well being located in, but isolated from, the first n-type well of the PMOS device and the second n-type well of the NMOS device.

The present invention further provides a method of manufacturing a semiconductor device structure, comprising the steps of:
providing a p-type substrate;
forming, in the p-type substrate, a PMOS device that has a first n-type well;
forming, in the p-type substrate, an NMOS device that has a second n-type well and a first p-type well in the second n-type well;
coupling the PMOS device and the NMOS device with each other in series between a voltage source and a GND; and
forming a capacitor connected to the p-type substrate and the GND respectively, the capacitor generating close-magnitude noises with opposite phases at a node located between the PMOS device and the voltage source and at another node located between the NMOS device and the GND.

Preferably, an MOS capacitor is formed by providing a third n-type well isolated from the GND in the p-type substrate, and further comprising a step of forming a second p-type well in the p-type substrate for P+ guarding. Preferably, an NMOS isolation ring n-well capacitor is formed by laying out the first n-type well and the second n-type well with the same shape and size. Preferably, an n-well junction capacitor is formed by providing a fourth n-type well to form an n-well junction and coupling the fourth n-type well to the GND. Preferably, an isolated p-well junction and a decoupling capacitor are formed between the voltage source and the GND, wherein the isolated p-well junction and the decoupling capacitor are formed with a third p-type well coupled to the GND, the third p-type well being located in, but isolated from, the first n-type well of the PMOS device and the second n-type well of the NMOS device.

The invention claimed is:

1. A buck converter formed in a substrate, comprising:
a P-channel Metal Oxide Semiconductor (PMOS) device formed in a p-type substrate and having a first n-type well, wherein a driver signal is input to a gate of the PMOS device;
a N-channel Metal Oxide Semiconductor (NMOS) device formed in the p-type substrate and having a second n-type well and a first p-type well in the second n-type well, wherein the driver signal is input to a gate of the NMOS device, and wherein the PMOS device and the NMOS device are coupled with each other in series between a voltage source and a GND; and
a capacitor connected to a first node connected between the PMOS device and the NMOS device, and the GND, respectively, the capacitor adapted to generate close-magnitude noises with opposite phases at a second node located between the PMOS device and the voltage source and at a third node located between the NMOS device and the GND.

2. The buck converter of claim 1, wherein the capacitor is a MOS capacitor.

3. The buck converter of claim 2, wherein the MOS capacitor has a third n-type well isolated from the GND, and wherein a second p-type well is formed in the p-type substrate for P+ guarding.

4. The buck converter of claim 1, wherein the capacitor is an NMOS isolation ring n-well capacitor.

5. The buck converter of claim 4, wherein the isolation ring capacitor is formed in the NMOS device by laying out the first n-type well and the second n-type well with the same shape and size.

6. The buck converter of claim 1, wherein the capacitor is an n-well junction capacitor.

7. The buck converter of claim 6, wherein the capacitor is formed by providing a fourth n-type well to form a n-well junction and coupling the fourth n-type well to the GND.

8. The buck converter of claim 1, wherein the capacitor comprises an isolated p-well junction and a decoupling capacitor located between the voltage source and the GND.

9. The buck converter of claim 8, wherein the isolated p-well junction and the decoupling capacitor are formed with a third p-type well coupled to the GND, the third p-type well being located in, but isolated from, the first n-type well of the PMOS device and the second n-type well of the NMOS device.

10. A semiconductor device structure, comprising:
a p-type substrate;
a P-channel Metal Oxide Semiconductor (PMOS) device that is formed in the p-type substrate and has a first n-type well;
a N-channel Metal Oxide Semiconductor (NMOS) device that is formed in the p-type substrate and has a second n-type well and a first p-type well in the second n-type well, and wherein the PMOS device and the NMOS device are coupled with each other in series between a voltage source and a GND; and
a capacitor connected to the p-type substrate and the GND respectively, the capacitor generating close-magnitude noises with opposite phases at a node located between the PMOS device and the voltage source and at another node located between the NMOS device and the GND.

11. The semiconductor device structure of claim 10, wherein the capacitor is a MOS capacitor.

12. The semiconductor device structure of claim 11, wherein the MOS capacitor has a third n-type well isolated from the GND, and wherein a second p-type well formed in the p-type substrate for P+ guarding.

13. The semiconductor device structure of claim 10, wherein the capacitor is an NMOS isolation ring n-well capacitor.

14. The semiconductor device structure of claim 13, wherein the NMOS isolation ring capacitor is formed in the NMOS device by laying out the first n-type well and the second n-type well with the same shape and size.

15. The semiconductor device structure of claim 10, wherein the capacitor is an n-well junction capacitor.

16. The semiconductor device structure of claim 15, wherein the capacitor is formed by providing a fourth n-type well to form an n-well junction and coupling the fourth n-type well to the GND.

17. The semiconductor device structure of claim 10, wherein the capacitor comprises an isolated p-well junction and a decoupling capacitor located between the voltage source and the GND.

18. The semiconductor device structure of claim 17, wherein the isolated p-well junction and the decoupling capacitor are formed with a third p-type well coupled to the GND, the third p-type well being located in, but isolated from, the first n-type well of the PMOS device and the second n-type well of the NMOS device.

* * * * *